(12) United States Patent
Liu et al.

(10) Patent No.: US 11,799,456 B2
(45) Date of Patent: Oct. 24, 2023

(54) CLOCK GENERATION CIRCUIT AND LATCH USING SAME, AND COMPUTING DEVICE

(71) Applicant: Canaan Creative (SH) Co., LTD., Shanghai (CN)

(72) Inventors: Jieyao Liu, Beijing (CN); Nangeng Zhang, Beijing (CN); Jingjie Wu, Beijing (CN); Shenghou Ma, Beijing (CN)

(73) Assignee: Canaan Creative (SH) Co., LTD., Shanghai (CN)

( * ) Notice: Subject to any disclaimer, the term of this patent is extended or adjusted under 35 U.S.C. 154(b) by 0 days.

(21) Appl. No.: 17/855,281

(22) Filed: Jun. 30, 2022

(65) Prior Publication Data

US 2022/0337229 A1    Oct. 20, 2022

Related U.S. Application Data

(63) Continuation of application No. PCT/CN2020/098899, filed on Jun. 29, 2020.

(30) Foreign Application Priority Data

Dec. 30, 2019    (CN) .......................... 201911422474.4

(51) Int. Cl.
*H03K 3/02* (2006.01)
*H03K 3/0233* (2006.01)
(Continued)

(52) U.S. Cl.
CPC ............. *H03K 3/0233* (2013.01); *G06F 1/06* (2013.01); *G06F 1/10* (2013.01); *H03K 3/017* (2013.01); *H03K 3/288* (2013.01); *H03K 19/20* (2013.01)

(58) Field of Classification Search
CPC ............ H03K 3/01; H03K 3/017; H03K 3/02; H03K 3/023; H03K 3/0233;
(Continued)

(56) References Cited

U.S. PATENT DOCUMENTS 4,968,906 A    11/1990    Pham et al.
5,453,707 A    9/1995    Hiratsuka et al.
(Continued)

FOREIGN PATENT DOCUMENTS

CN    102075167 A    5/2011
CN    102185590 A    9/2011
(Continued)

OTHER PUBLICATIONS

Extended European Search Report issued for European Application No. 20908872.3, dated Jan. 3, 2023, 13 pages.
(Continued)

*Primary Examiner* — Long Nguyen

(57) ABSTRACT

A clock generation circuit, a latch using same, and a computing device are provided. The clock generation circuit includes an input end, configured to input a pulse signal; a first output end, configured to output a first clock signal; a second output end, configured to output a second clock signal; and an input drive circuit, a latch circuit, an edge shaping circuit, a feedback delay circuit, and an output drive circuit, where the input drive circuit, the latch circuit, the edge shaping circuit, the feedback delay circuit, and the output drive circuit are sequentially connected between the input end and the first output end as well as the second output end in series. A clock pulse can be effectively shaped, the use of a clock buffer can be reduced, and the correctness and accuracy of data transmission and latching can be improved.

20 Claims, 14 Drawing Sheets

(51) Int. Cl.
*H03K 3/017* (2006.01)
*H03K 3/288* (2006.01)
*G06F 1/06* (2006.01)
*G06F 1/10* (2006.01)
*H03K 19/20* (2006.01)

(58) Field of Classification Search
CPC .... H03K 3/02332; H03K 3/027; H03K 3/288; H03K 3/037; H03K 3/0372; H03K 3/353; H03K 3/356; H03K 3/356104; H03K 3/356113; H03K 3/3562; H03K 19/20; G06F 1/04; G06F 1/06; G06F 1/08; G06F 1/10

See application file for complete search history.

(56) References Cited

U.S. PATENT DOCUMENTS

| | | | |
|---|---|---|---|
| 5,767,720 A | 6/1998 | Osera et al. | |
| 6,049,883 A | 4/2000 | Tjandrasuwita | |
| 6,169,704 B1 | 1/2001 | Sher | |
| 7,061,822 B2 * | 6/2006 | Jung | G11C 7/22 365/194 |
| 9,627,012 B1 | 4/2017 | Huott et al. | |
| 2003/0000857 A1 | 5/2003 | Ryu | |
| 2003/0085748 A1 | 5/2003 | Ryu | |
| 2003/0151435 A1 * | 8/2003 | Ma | H03K 5/1565 327/175 |
| 2007/0152726 A1 | 7/2007 | Wu et al. | |
| 2008/0074151 A1 | 3/2008 | Kim | |
| 2008/0238514 A1 | 10/2008 | Kim | |
| 2013/0117598 A1 | 5/2013 | Lee | |
| 2014/0218092 A1 | 8/2014 | Luo | |
| 2017/0016776 A1 | 1/2017 | Ma et al. | |
| 2019/0007045 A1 | 1/2019 | Hirashima et al. | |

FOREIGN PATENT DOCUMENTS

| | | |
|---|---|---|
| CN | 103092255 A | 5/2013 |
| CN | 103837243 A | 6/2014 |
| CN | 1357135 A | 7/2020 |
| JP | 2019008859 A | 1/2019 |
| KR | 100853649 B1 | 8/2008 |
| WO | 9950821 A1 | 10/1999 |

OTHER PUBLICATIONS

Second Office Action issued for Chinese Application No. 201911422474.4, dated Sep. 6, 2022, 16 pages.
International Search Report for PCT Application No. PCT/CN2020/098899 dated Sep. 28, 2020.
Written Opinion of the Searching Authority for PCT Application No. PCT/CN2020/098899 dated Sep. 28, 2020.
First Office Action with search result for Chinese Application No. 201911422474.4, dated Apr. 15, 2022.
Wang, "Fundamental Digital Electronic Technique," pp. 48-50, May 31, 2018.
Wang, "A low voltage high speer 10bit pipelined ADC," China Integrated Circuit, pp. 27-33, Aug. 8, 2008, with English Abstract.
Zhu et al., "Two Phase Non-Overlap Clock Generator with Independent Pulse Width Adjusting," pp. 1032-1035, Oct. 31, 2009, with English Abstract.
Xu et al., "The Design of Low Power Dissipation Pipeline ADC in CCD Image Processor," vol. 27, No. 7, pp. 164-167, Jul. 31, 2010, with English Abstract.

* cited by examiner (1)

(2)

__US 11,799,456 B2__

CLOCK GENERATION CIRCUIT AND LATCH USING SAME, AND COMPUTING DEVICE

CROSS REFERENCE TO RELATED APPLICATIONS

This application is a continuation application of International Patent Application No. PCT/CN2020/098899, filed on Jun. 29, 2020 and titled "CLOCK GENERATION CIRCUIT AND LATCH USING SAME, AND COMPUTING DEVICE," which claims priority to Chinese Patent Application No. 201911422474.4 filed on Dec. 30, 2019. The contents of all the above-identified applications are incorporated herein by reference in their entirety.

TECHNICAL FIELD

This application relates to a storage device controlled by a clock, and in particular to a clock generation circuit, a latch using same, and a computing device applied to a large-scale data computing device.

BACKGROUND

Latches are widely used to register digital signals. In this field and other similar fields, how to effectively reduce a quantity of buffers, avoid data collusion of cascaded latches, improve the correctness and accuracy of data transmission and latching are problems to be addressed.

SUMMARY

This application provides a clock generation circuit, a latch using same, and a computing device, which may effectively shape a clock pulse, reduce the use of a clock buffer, and improve the correctness and accuracy of data transmission and latching.

To achieve the objective, in some embodiments, this application provides a clock generation circuit, including: an input end, configured to input a pulse signal; a first output end, configured to output a first clock signal; a second output end, configured to output a second clock signal; and an input drive circuit, a latch circuit, an edge shaping circuit, a feedback delay circuit, and an output drive circuit, where the input drive circuit, the latch circuit, the edge shaping circuit, the feedback delay circuit, and the output drive circuit are sequentially connected between the input end and the first output end as well as the second output end in series.

To better achieve the objective, in some embodiments, this application further provides a latch, including: a data input end, configured to input a data signal; a data output end, configured to output the data signal; a clock signal input end, configured to input a first clock signal; a plurality of levels of latch circuits, sequentially connected between the data input end and the data output end in series according to a first sequence; and a plurality of levels of clock generation circuits, sequentially connected in series according to a second sequence and electrically connected to the plurality of levels of latch circuits, where a direction of the first sequence is opposite to a direction of the second sequence, and the clock generation circuit is the clock generation circuit.

To better achieve the objective, in some embodiments, this application further provides a computing device, including one or more latches.

The following describes this application in detail with reference to the accompanying drawings and specific embodiments, but should not be used as a limitation on this application.

REFERENCE NUMERALS

Figure 1:
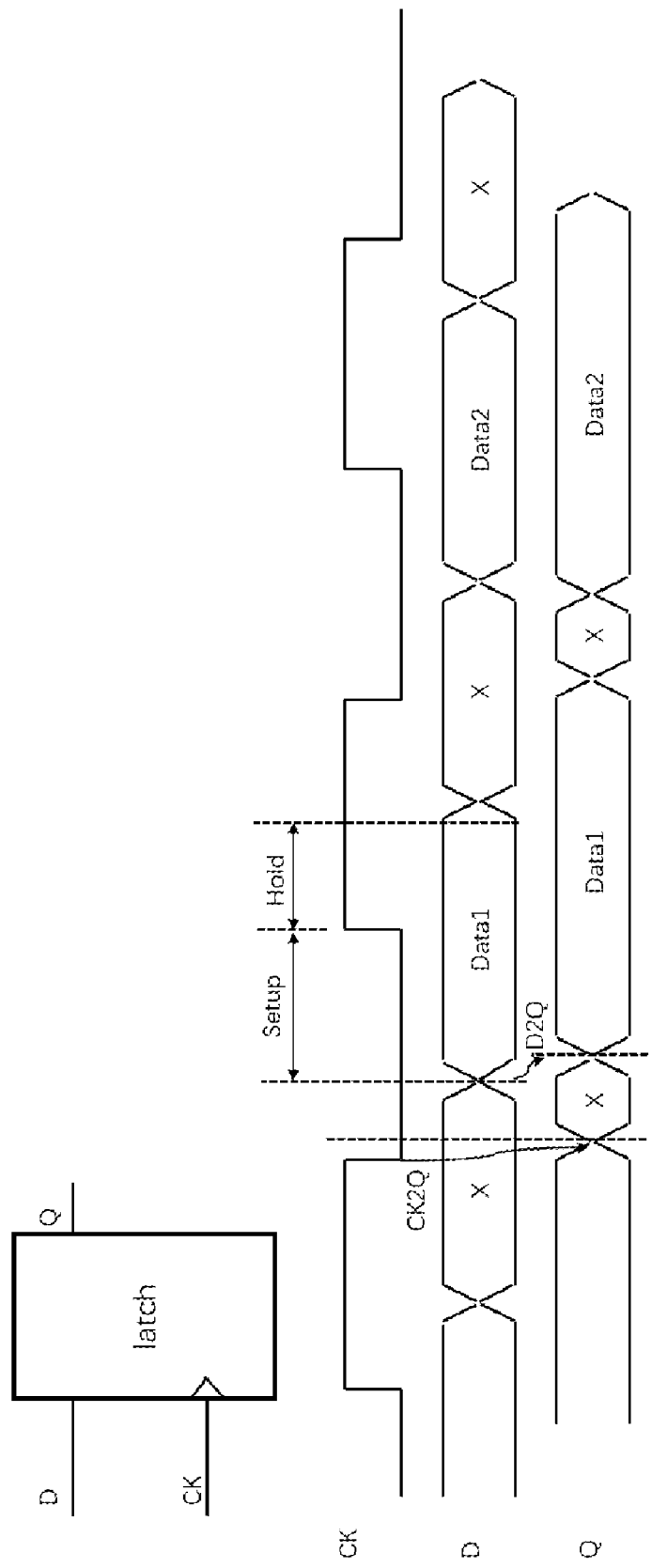
FIG. 1 is a block circuit diagram and a sequence diagram of an existing latch.

100. Clock generation circuit
101. Input drive circuit
102. Latch circuit
103. Edge shaping circuit
104. Feedback delay circuit
105. Output drive circuit
200. Latch
INV1, INV2, INV3, INV4, and INV5: Inverters
NAND1 and NAND2: NAND gates
P1, P2, and P3: PMOS transistors
N1, N2, and N3: NMOS transistors
CKG, CKG1, CKG2, and CKG3: Clock generation circuits
CKI: Input end
CKO1: First output end
CKO2: Second output end
CKP1, CKP2, and CKP3: Clock signals
Latch1, latch2, and latch3: Latch circuits
D1, D2, and D3: Input ends
Q1, Q2, and Q3: Output ends DC: Delay circuit
VDD: Power supply
VSS: Ground

DETAILED DESCRIPTION

The structural principle and the working principle of this application are described below in detail with reference to the accompanying drawings.

Some terms are used to refer to specific components in the specification and the appended claims. Those of ordinary knowledge in the art should understand that manufacturers may designate the same component with different names. In the specification and the appended claims, a difference in function of components rather than a difference in name is used as a standard for distinguishing between components.

The terms "include" and "comprise" mentioned in the whole specification and the appended claims are open terms and therefore should be explained as "included but not limited to." In addition, the term "being connected" includes any one of the direct or indirect means of connections (e.g., electrical connection). The indirect means of electrically connection includes a connection via one or more other components.

FIG. 1 is a block circuit diagram and a sequence diagram of an existing latch. As shown in FIG. 1, the latch includes an input end D, an output end Q, and a clock signal end CK. The operating principle of the latch is that when the clock signal CK is at a low level "0," data of the input end D is transmitted to the output end Q and latched by the latch until a next clock period. In addition, it can be learned from FIG. 1 that the data transmitted to the output end Q has delays relative to the clock signal CK and the input end D. For example, the delay relative to the clock signal CK is CK2Q, and the delay relative to the input end D is D2Q. When a plurality of latches are connected in series, data collusion occurs.

Figure 2:
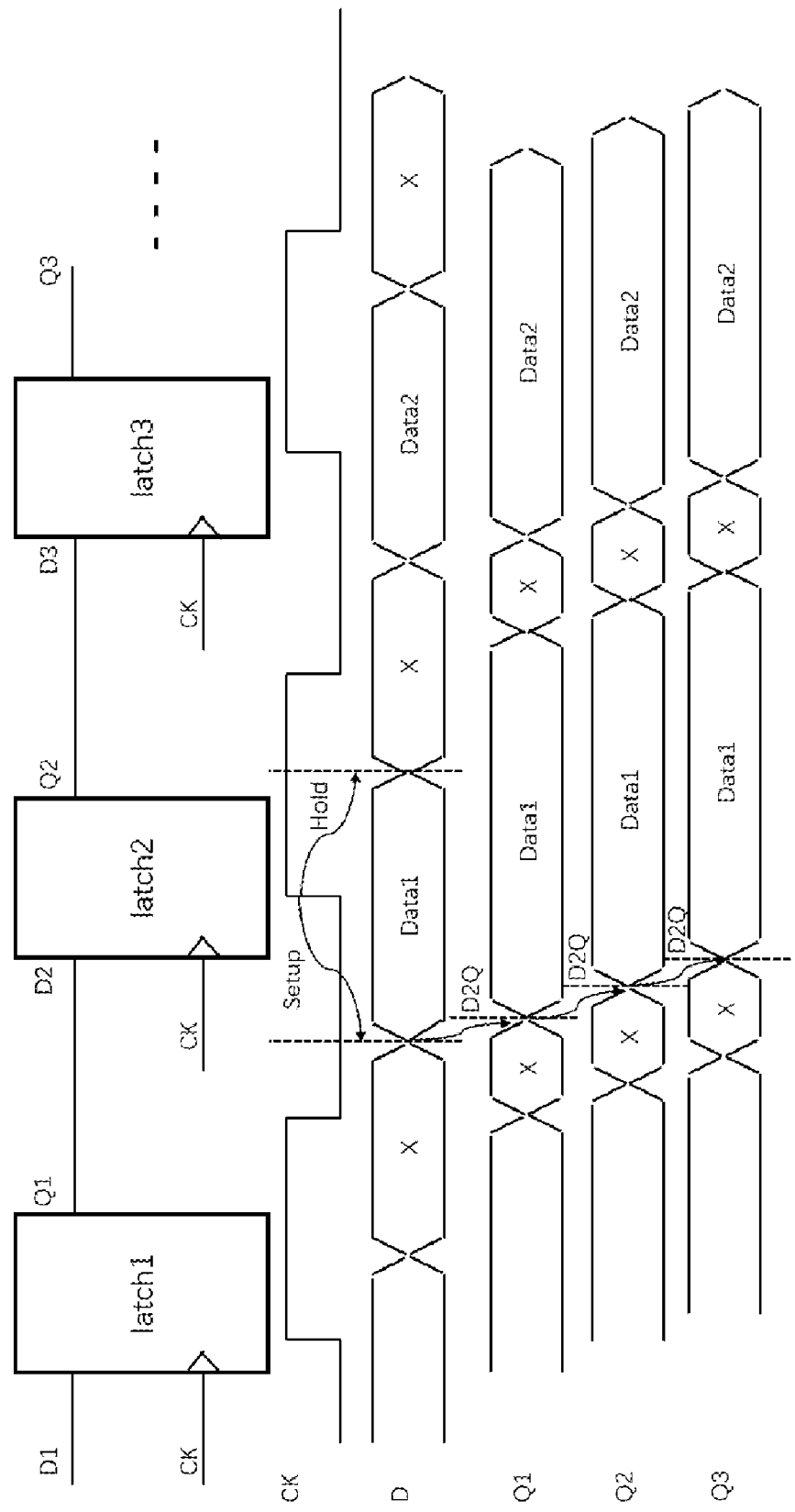
FIG. 2 is a schematic diagram of a circuit structure and a sequence diagram of existing cascaded latches.

FIG. 2 is a schematic diagram of a circuit structure and a sequence diagram of cascaded latches. As shown in FIG. 2, when a plurality of latches latch1, latch2, latch3, . . . , and the like are connected in series, a clock signal end CK of each level of the latches is connected to the same clock signal. Because when the clock signal is at a low level, data of an input end D of a former-level latch is directly transmitted to an output end Q, and a latter-level latch directly transmits new data to a next-level latch, causing data collusion. To resolve the data collusion, phases of the clock signals are staggered, and pulse widths of the clock signals are reduced.

Figure 3:
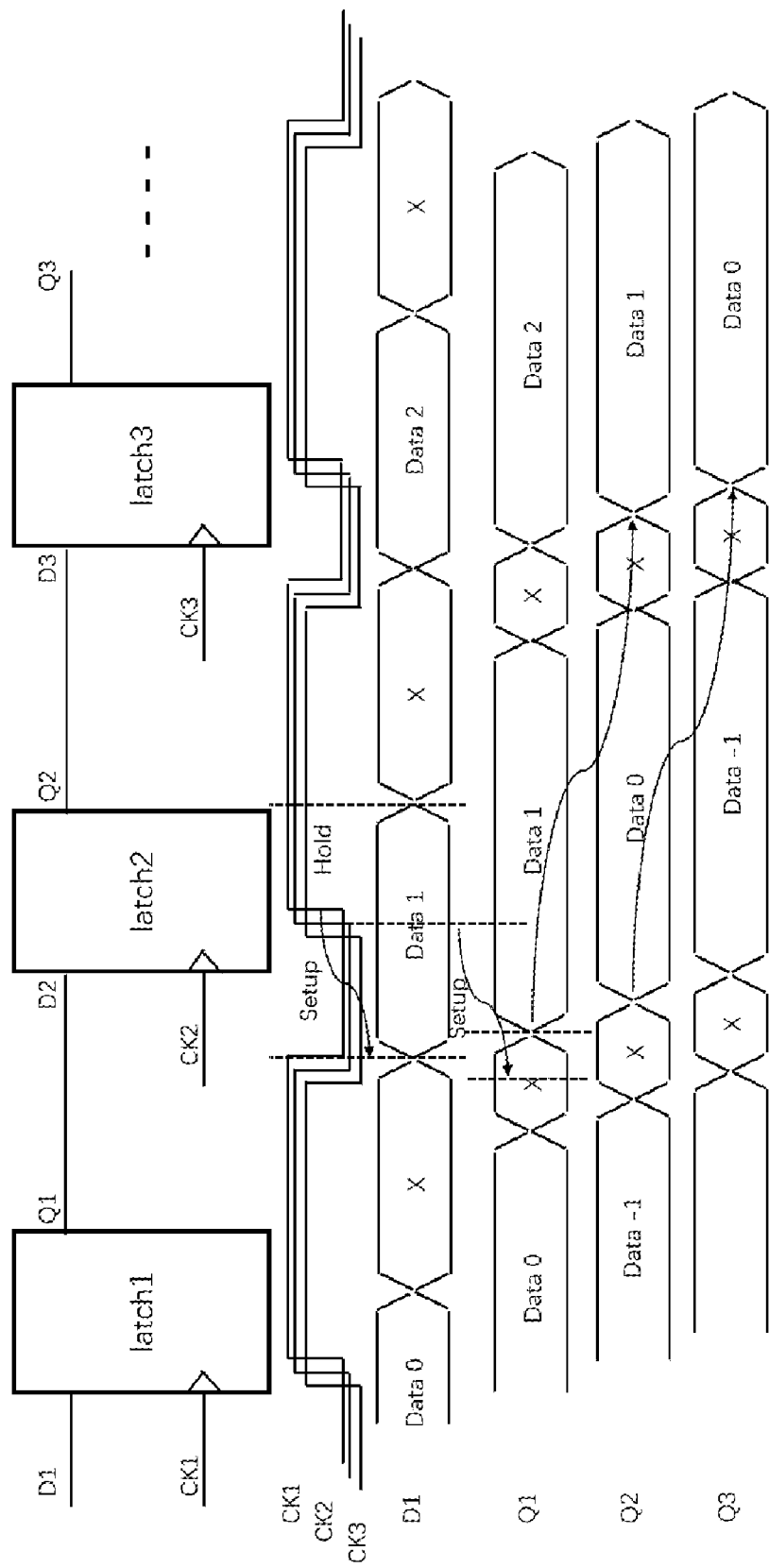
FIG. 3 is a schematic diagram of a circuit structure and a sequence diagram of existing cascaded latches using different clock signals in a first manner.

FIG. 3 is a schematic diagram of a circuit structure and a sequence diagram of cascaded latches using different clock signals in a first manner. As shown in FIG. 3, when a plurality of latches—latch1, latch2, latch3, . . . , and the like—are connected in series, a clock signal end CK of each level of the latches is connected to different clock signals. For example, a clock signal end CK of a latch latch1 is connected to a clock signal CK1, a clock signal end CK of a latch latch2 is connected to a clock signal CK2, a clock signal end CK of a latch latch3 is connected to a clock signal CK3, and so on. The first three-level latches—latch1, latch2, and latch3—are used as an example. It can be learned from FIG. 3 that because phases of the clock signals CK1, CK2, and CK3 are staggered, data inputted by the input end D is transmitted in a direction of the latches—latch1, latch2, and latch3—that is, the data arrives at the latch latch1 first and arrives at latch3 at the latest. Because the clock signals CK1, CK2, and CK3 have different delays, a falling edge of the clock signal CK3 arrives at latch3 first, and a falling edge of the clock signal CK1 arrives at latch1 at the latest; that is, the latch at which the data arrives first is the latch at which the falling edge of the clock arrives the latest. Therefore, the data transmitted by the latches latch1, latch2, and latch3 is transmitted among a plurality of latches latch1, latch2, latch3 in sequence, to effectively avoid data collusion. In this case, another problem is caused.

Figure 4:
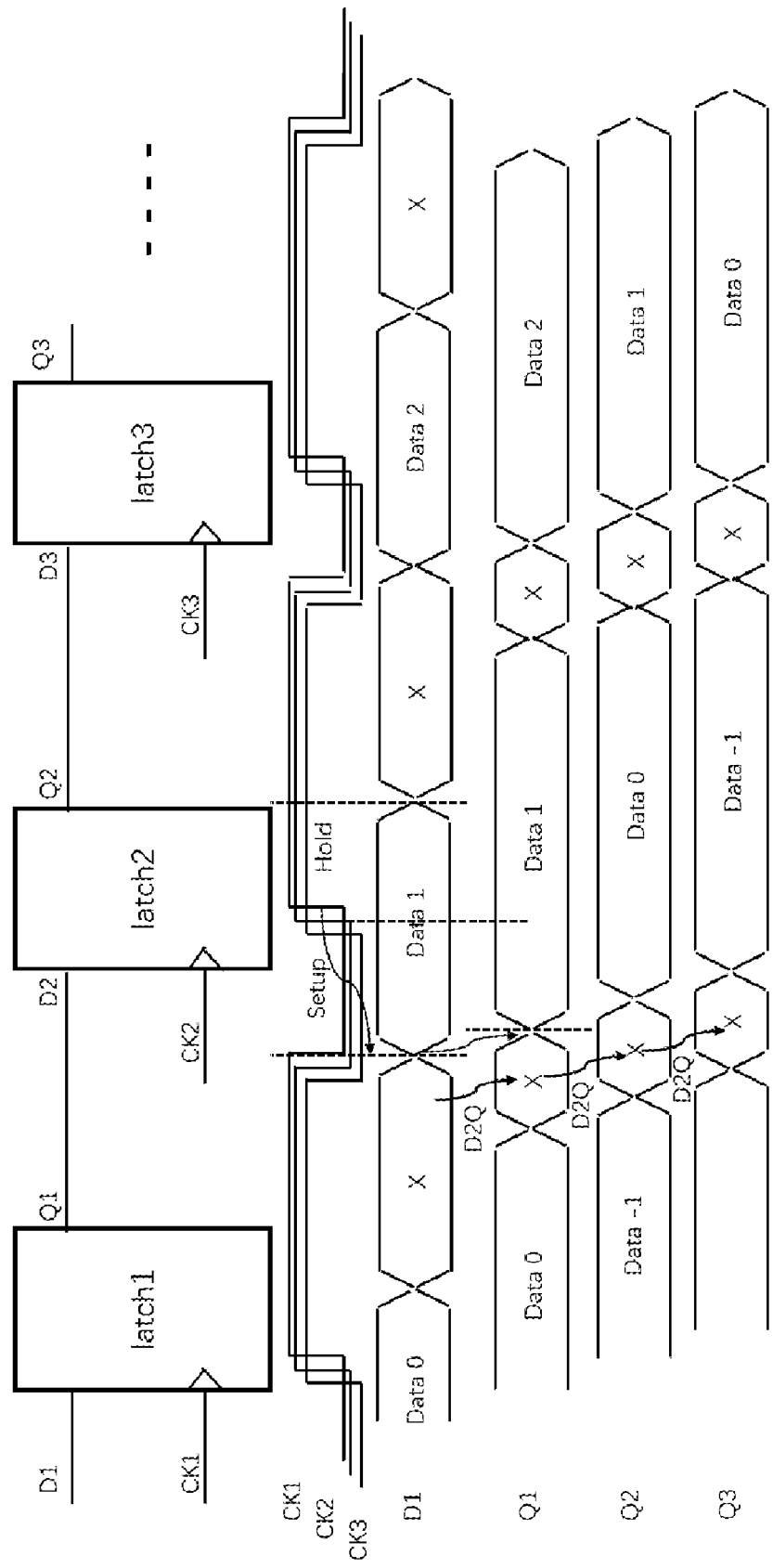
FIG. 4 is a schematic diagram of a circuit structure and a sequence diagram of existing cascaded latches using different clock signals in another manner.

FIG. 4 is a schematic diagram of a circuit structure and a sequence diagram of cascaded latches using different clock signals in another manner. As shown in FIG. 4, when a plurality of latches—latch1, latch2, latch3, . . . , and the like—are connected in series, a clock signal end CK of each of the latches is connected to different clock signals. For example, a clock signal end CK of a latch latch1 is connected to a clock signal CK1, a clock signal end CK of a latch latch2 is connected to a clock signal CK2, a clock signal end CK of a latch latch3 is connected to a clock signal CK3, and so on. It can be learned from FIG. 4 that when the phases of the clock signals CK1, CK2, and CK3 cannot be completely staggered, or when pulse widths of the clock signals CK1, CK2, and CK3 are excessively wide, data between unstable states of the latches colludes. A non-ideal pulse signal (glitch) directly colludes to a next level due to data collusion, resulting in higher power consumption. Further, power consumption of a computing chip using the latch exceeds expectation. This collusion of the pulse signal is also referred to as holddown in conventional timing analysis. In addition, a large quantity of buffers are required for completely staggering the phases between the clock signals.

Therefore, how to effectively reduce a quantity of buffers, avoid data collusion of cascaded latches, improve the correctness and accuracy of data transmission, and latching are problems to be resolved.

Figure 5:
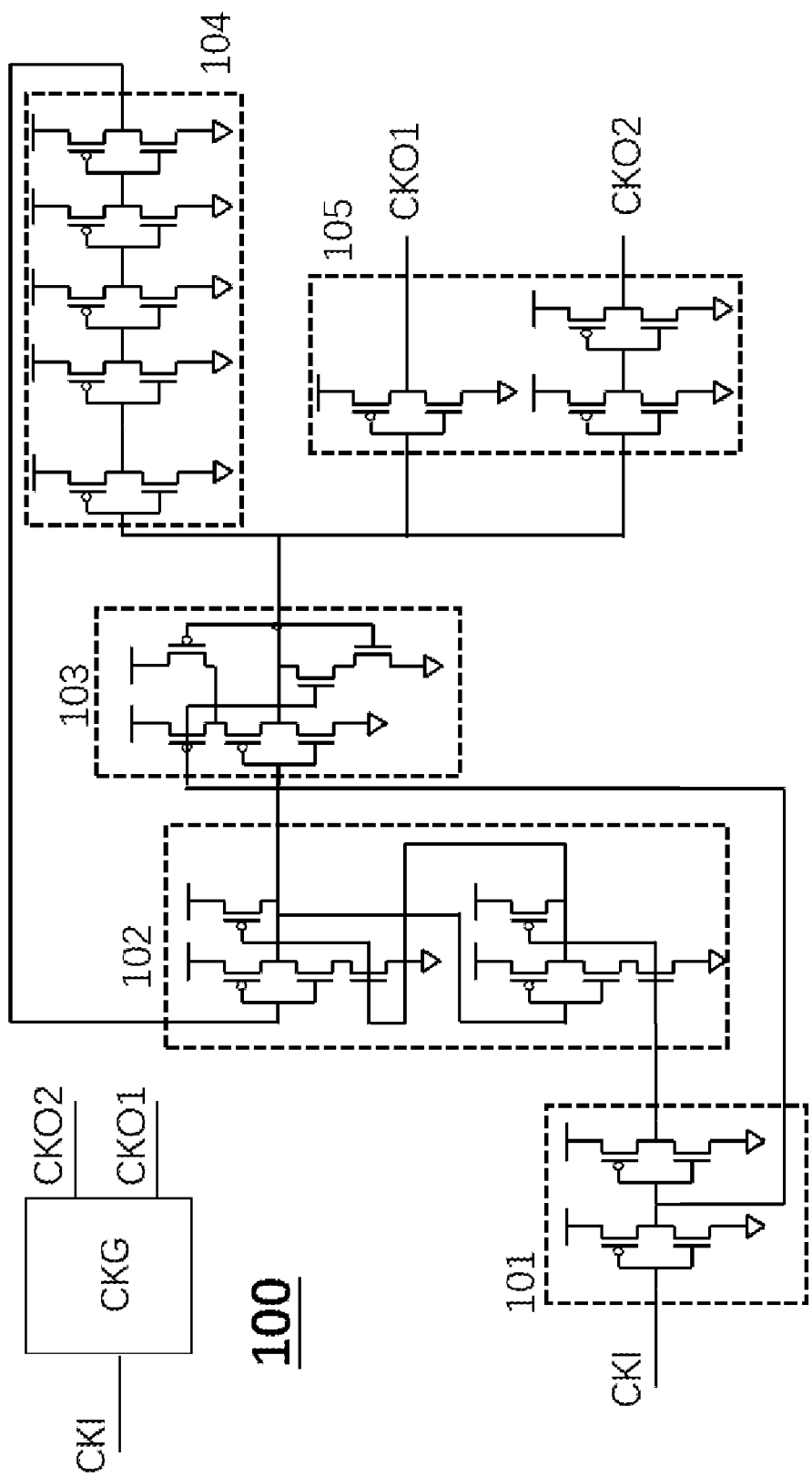
FIG. 5 is a schematic diagram of a circuit structure of a clock generation circuit, according to an embodiment of this application.

FIG. 5 is a schematic diagram of a circuit structure of a clock generation circuit, according to an embodiment of this application. As shown in FIG. 5, a clock generation circuit 100 includes an input end CKI, a first output end CKO1, and a second output end CKO2. An input drive circuit 101, a latch circuit 102, an edge shaping circuit 103, a feedback delay circuit 104, and an output drive circuit 105 are sequentially connected between the input end CKI and the first output end CKO1 as well as the second output end CKO2 in series.

Figure 6:
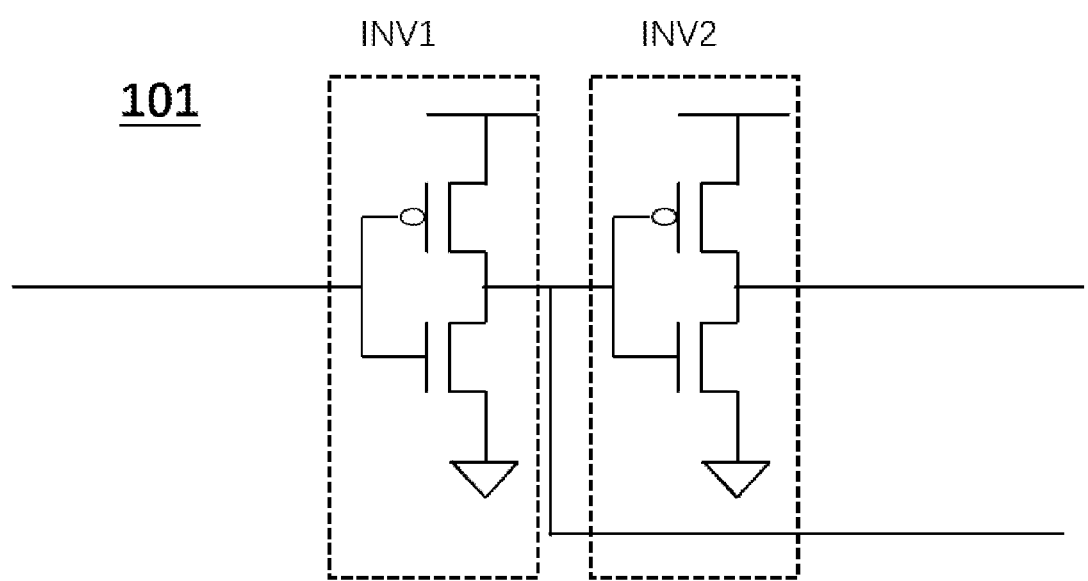
FIG. 6 is a schematic diagram of a circuit structure of an input drive circuit, according to an embodiment of this application.

FIG. 6 is a schematic diagram of a circuit structure of an input drive circuit, according to an embodiment of this application. As shown in FIG. 5 and FIG. 6, the input drive circuit 101 is formed by two inverters INV1 and INV2 that are connected in series. Each of the inverters INV1 and INV2 includes an input end and an output end. The input end of the inverter INV1 is electrically connected to the input end CKI of the clock generation circuit 100 and is configured to provide an initial clock signal to the clock generation circuit 100. The output end of the inverter INV1 is electrically connected to the input end of the inverter INV2 and is electrically connected to the edge shaping circuit 103, while the output end of the inverter INV2 is electrically connected to the latch circuit 102. In this application, only the two inverters connected with each other in series are used as an example. The input drive circuit 101 may alternatively be formed by a plurality of inverters connected in series, which is subject to enable two output signals electrically connected to the edge shaping circuit 103 and electrically connected to the latch circuit 102 to have inverted phases. This is not limited in this application.

Figure 7:
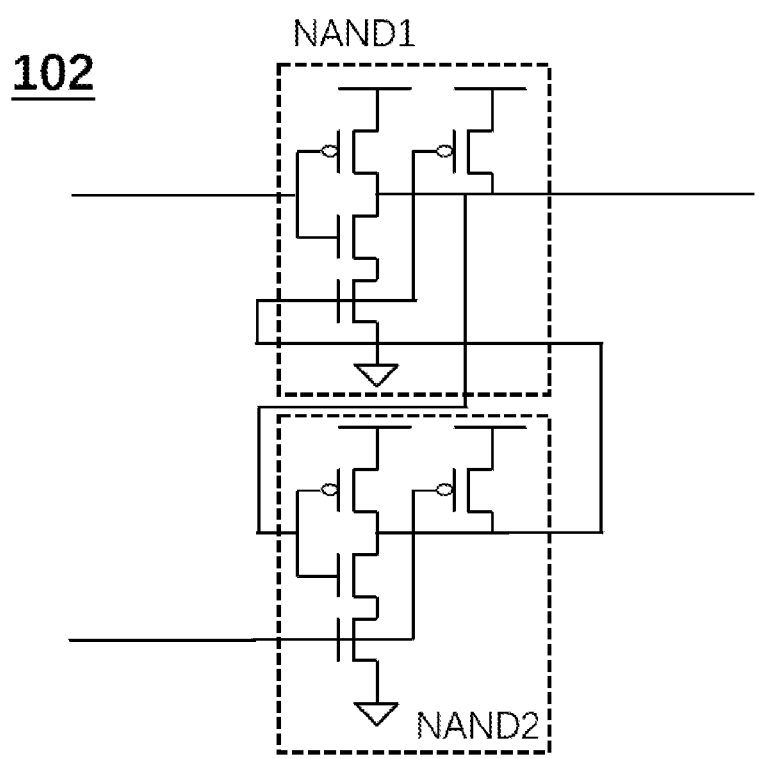
FIG. 7 is a schematic diagram of a circuit structure of a latch circuit, according to an embodiment of this application.

FIG. 7 is a schematic diagram of a circuit structure of a latch circuit, according to an embodiment of this application.

As shown in FIG. 5 to FIG. 7, the latch circuit 102 is formed by two NAND gates, NAND1 and NAND2, that are in cross-connection with each other. Each of the NAND gates NAND1 and NAND2 includes a first input end, a second input end, and an output end. The first input end of the NAND gate NAND1 is electrically connected to the output end of the NAND gate NAND2; the second input end of the NAND gate NAND1 is electrically connected to the feedback delay circuit 104; the output end of the NAND gate NAND1 is electrically connected to the edge shaping circuit 103 and the second input end of the NAND gate NAND2; and the first input end of the NAND gate NAND2 is electrically connected to the output end of the inverter INV2.

Figure 8:
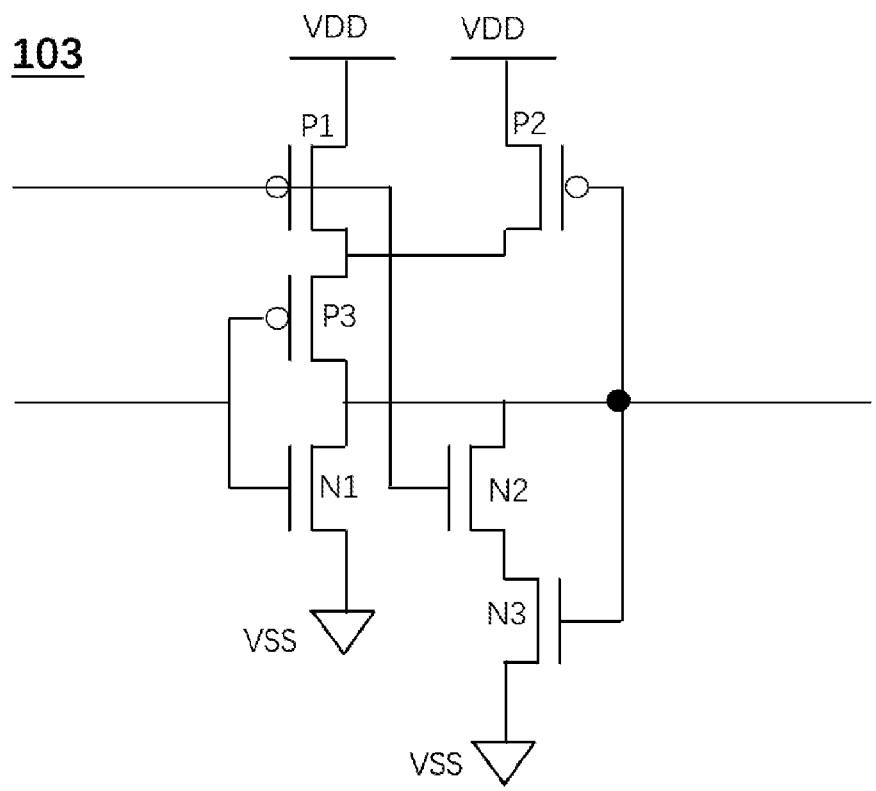
FIG. 8 is a schematic diagram of a circuit structure of an edge shaping circuit, according to an embodiment of this application.

FIG. 8 is a schematic diagram of a circuit structure of an edge shaping circuit, according to an embodiment of this application. As shown in FIG. 5 to FIG. 8, the edge shaping circuit includes PMOS transistors P1, P2, and P3 as well as NMOS transistors N1, N2, and N3. Each of the PMOS transistors or each of the NMOS transistors includes a first end, a second end, and a control end. The first ends of the PMOS transistors P1 and P2 are electrically connected to a power supply VDD; the second ends of the PMOS transistors P1 and P2 are electrically connected to the first end of the PMOS transistor P3, the second end of the PMOS transistor P3 is respectively electrically connected to the first ends of the NMOS transistors N1 and N2; the second end of the NMOS transistor N2 is electrically connected to the first end of the NMOS transistor N3; the second ends of the NMOS transistors N1 and N3 are electrically connected to a ground VSS; the control ends of the PMOS transistor P1 and the NMOS transistor N2 are electrically connected to the output end of the inverter INV1; the control ends of the PMOS transistor P3 and the NMOS transistor N1 are electrically connected to the output end of the NAND gate NAND1; and the control ends of the PMOS transistor P2 and the NMOS transistor N3 are electrically connected to the second end of the PMOS transistor P3 and are electrically connected to the feedback delay circuit 104 as well as the output drive circuit 105.

Figure 9:
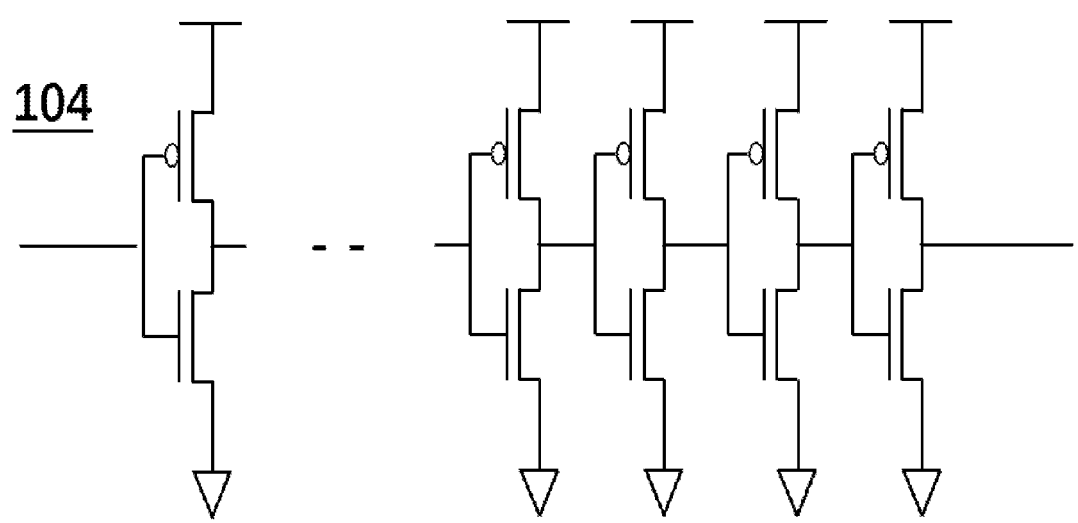
FIG. 9 is a schematic diagram of a circuit structure of a feedback delay circuit, according to an embodiment of this application.

FIG. 9 is a schematic diagram of a circuit structure of a feedback delay circuit, according to an embodiment of this application. As shown in FIG. 5 to FIG. 9, the feedback delay circuit 104 is formed by a plurality of inverters connected in series. The feedback delay circuit 104 includes an input end and an output end. The input end of the feedback delay circuit 104 is electrically connected to the second end of the PMOS transistor P3 in the edge shaping circuit 103, and the output end of the feedback delay circuit 104 is electrically connected to the second input end of the NAND gate NAND1. The odd-numbered inverters form the feedback delay circuit 104, to output a signal inverted to that of the input end. A specific quantity depends on a duration required by delaying an input signal. This is not limited in this application.

Figure 10:
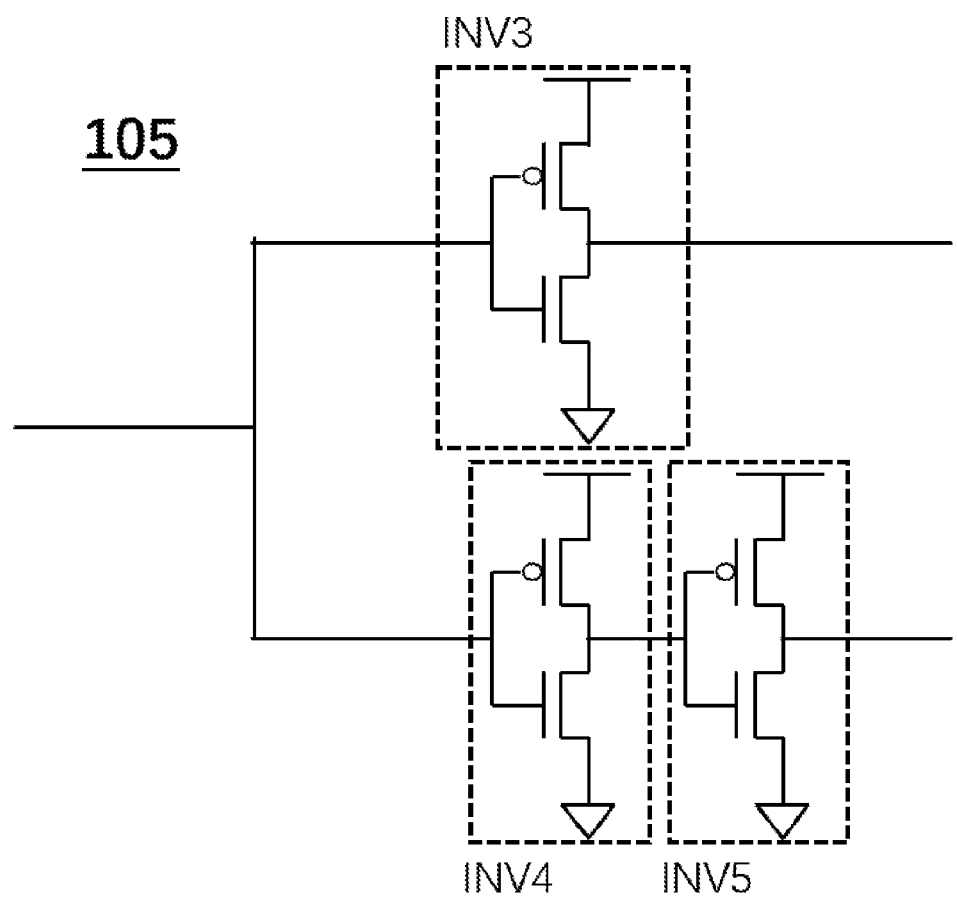
FIG. 10 is a schematic diagram of a circuit structure of an output drive circuit, according to an embodiment of this application.

FIG. 10 is a schematic diagram of a circuit structure of an output drive circuit, according to an embodiment of this application. As shown in FIG. 5 to FIG. 10, the output drive circuit 105 includes inverters INV3, INV4, and INV5. Each of the inverters INV3, INV4, and INV5 includes an input end and an output end. The input end of the inverter INV3 is electrically connected to the second end of the PMOS transistor P3 in the edge shaping circuit 103; the output end of the inverter INV3 is electrically connected to the first output end CKO1; the input end of the inverter INV4 is electrically connected to the input end of the inverter INV3 and the input ends of the inverters INV 3 and INV4 are jointly connected to the second end of the PMOS transistor P3 in the edge shaping circuit 103; the output end of the inverter INV4 is electrically connected to the input end of the inverter INV5; and the output end of the inverter INV5 is electrically connected to the second output end CKO2. In this application, a description is made by using only one inverter INV3, one inverter INV4, and one inverter INV5. The inverters INV3, INV4, and INV5 may alternatively be formed by connecting a plurality of inverters in series, which is subject to inversion of output signals of the first output end CKO1 and the second output end CKO2. This is not limited in this application.

Figure 11:
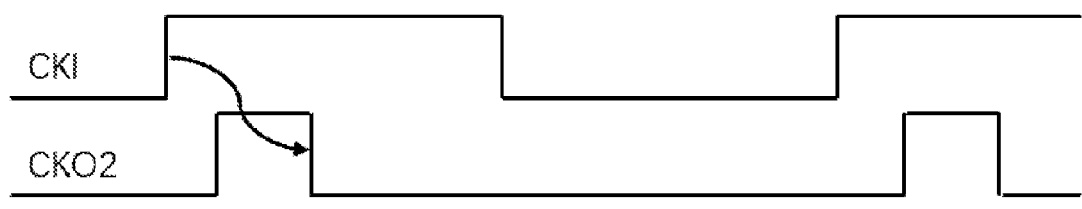
FIG. 11 is a schematic waveform diagram of a clock signal of a second output end of a clock generation circuit.
Figure 11:
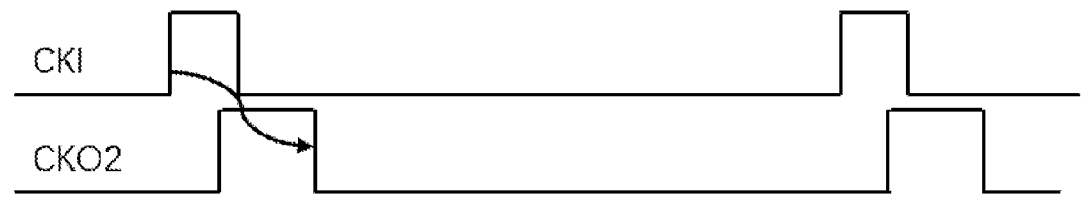

Therefore, as shown in FIG. 5 to FIG. 10, an initial clock signal is inputted into the clock generation circuit 100 from the input end CM, and two phase-inverted clock signals are generated by the clock generation circuit 100 and are respectively outputted by using the first output end CKO1 and the second output end CKO2. FIG. 11 is a schematic waveform diagram of a clock signal of a second output end of a clock generation circuit. As shown in FIG. 1 and FIG. 11, the clock signals outputted by the first output end CKO1 and the second output end CKO2 of the clock generation circuit 100 are related to only a rising edge of the initial clock signal inputted by the input end CKI. Therefore, a pulse width of the clock signal outputted by the second output end CKO2 of the clock generation circuit 100 does not change regardless of whether a pulse width of the initial clock signal inputted by the input end CKI of the clock generation circuit 100 is wide or narrow.

Figure 12:
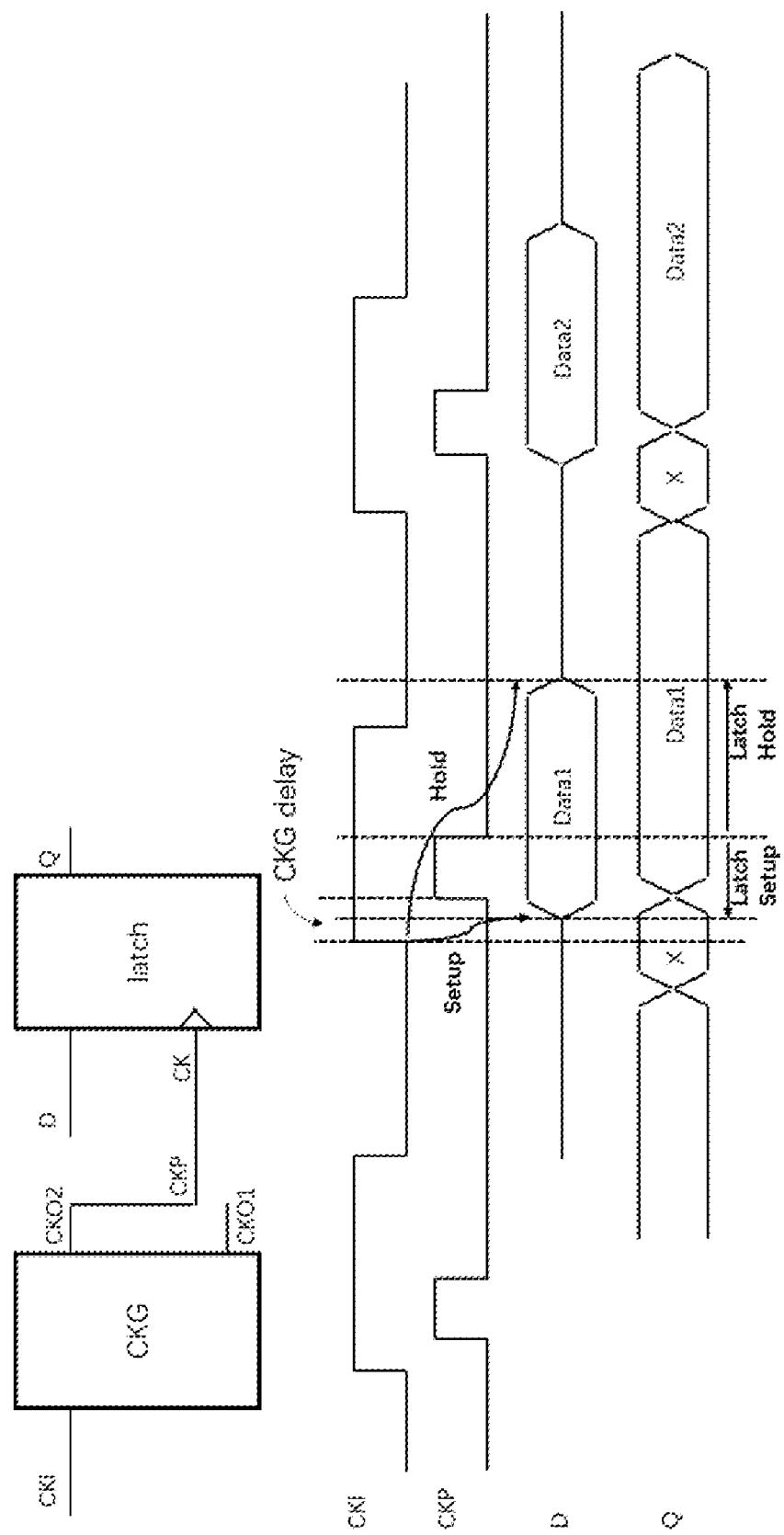
FIG. 12 is a sequence diagram of a latch unit under the control of a clock generation circuit, according to an embodiment of this application.

FIG. 12 is a sequence diagram of a latch unit under the control of a clock generation circuit, according to an embodiment of this application. As shown in FIG. 12, for the latch unit latch, correct transmission of data depends on a data setup time and a data hold time. A data hold require time, a data setup require time, a latch unit hold time, a latch unit setup time, a CK gen delay time, and a clock pulse width need to satisfy the following relationships:

Hold Require Time=Latch Hold+(*CK* Gen Delay+ Pulse Width)   (formula 1); and

Setup Require Time=Latch Setup-(*CK* Gen Delay+ Pulse Width)   (formula 2).

If Latch Setup is less than Pulse Width, to ensure that data between unstable states of the cascaded latch units does not collude, Setup Require Time=max(Latch setup, Pulse Width) is required, so that the pulse width of the clock signal is limited. If Latch Setup is greater than Pulse Width, writing cannot be performed. That is, the entire data writing stage of the latch unit cannot meet a data setup requirement. Therefore, this application provides the following latch.

Figure 13:
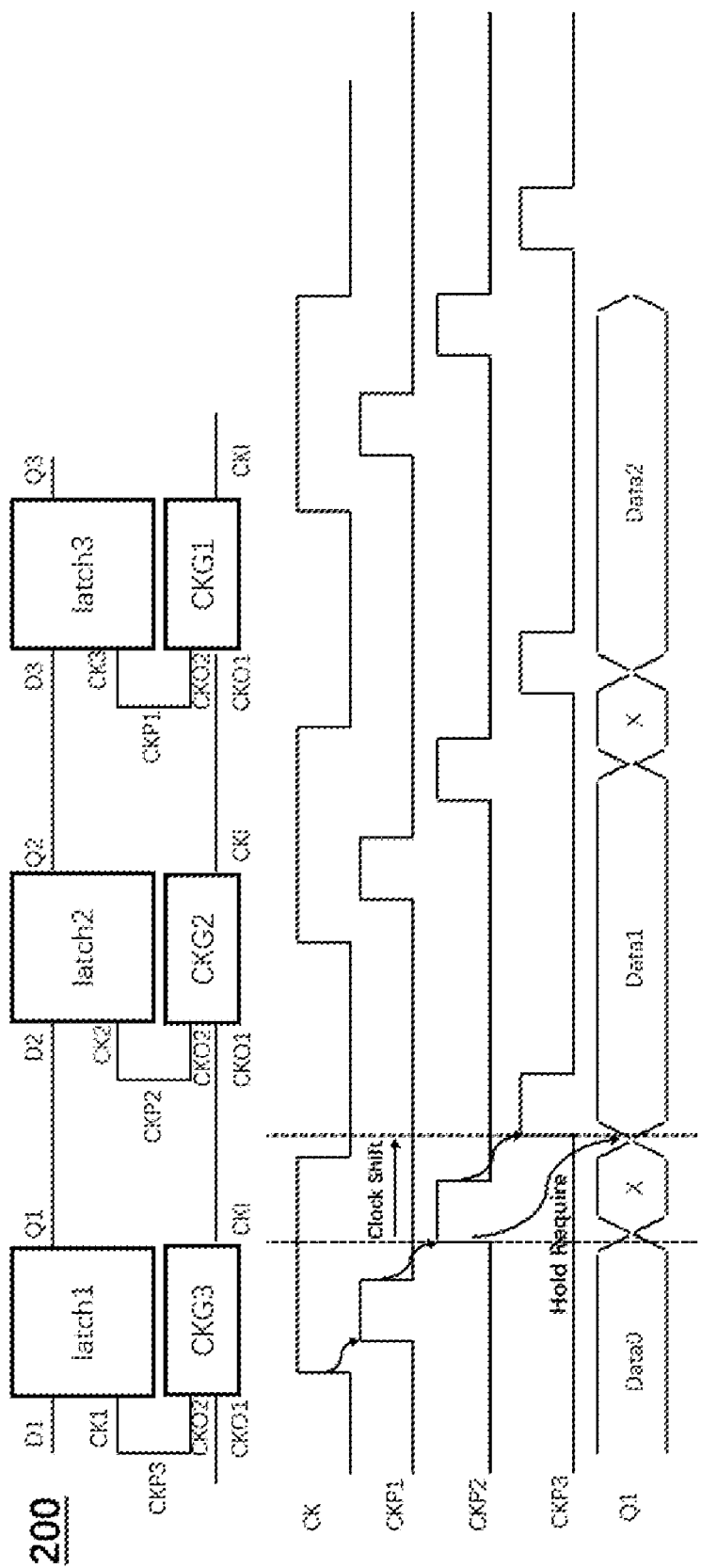
FIG. 13 is a schematic diagram of a circuit structure and a sequence diagram of a latch, according to an embodiment of this application.

FIG. 13 is a schematic diagram of a circuit structure and a sequence diagram of a latch, according to an embodiment of this application. As shown in FIG. 13, the latch 200 includes cascaded latch circuits latch1, latch2, and latch3 and cascaded clock generation circuits CKG1, CKG2, and CKG3. In this application, an example in which a quantity of levels is three is used for description. In an actual application, there may be more levels. This is not limited in this application. A cascading sequence of the latch circuits—latch1, latch2, and latch3—is a data transmission sequence, that is, from latch1 to latch2 to latch3; and a cascading sequence of the clock generation circuits CKG1, CKG2, and CKG3 is a clock signal transmission sequence, that is, from CKG1 to CKG2 to CKG3. The first-level clock generation circuit CKG1 is electrically connected to the third-level latch circuit latch3; the second-level clock generation circuit CKG2 is electrically connected to the second-level latch circuit latch2; and the third-level clock generation circuit CKG3 is electrically connected to the first-level latch circuit latch1. That is, the cascading sequence of the latch circuits—latch1, latch2, and latch3—is opposite to the cascading sequence of the clock generation circuits.

For a detailed description, referring to FIG. 13 again, the second output ends—CKG2 of the clock generation circuits CKG1, CKG2, and CKG3 respectively—provide clock signals CKP1, CKP2, and CKP3 to the latch circuits latch3, latch2, and latch1. The first output end CKO1 of the clock generation circuit CKG1 is electrically connected to the input end CM of the clock generation circuit CKG2, and the first output end CKO1 of the clock generation circuit CKG2 is electrically connected to the input end CKI of the clock generation circuit CKG3. The clock signal outputted by the first output end CKO1 and the clock signal outputted by the second output end CKO2 have inverted phases. Therefore, phases of the clock signals CKP1, CKP2, and CKP3 are completely staggered, and no phases overlap. This achieves higher efficiency compared with a case that the phases of the clock signals CKP1, CKP2, and CKP3 are staggered by connecting buffers, and more reliably ensures that the phases are completely staggered, and the buffers reduced.

Figure 14:
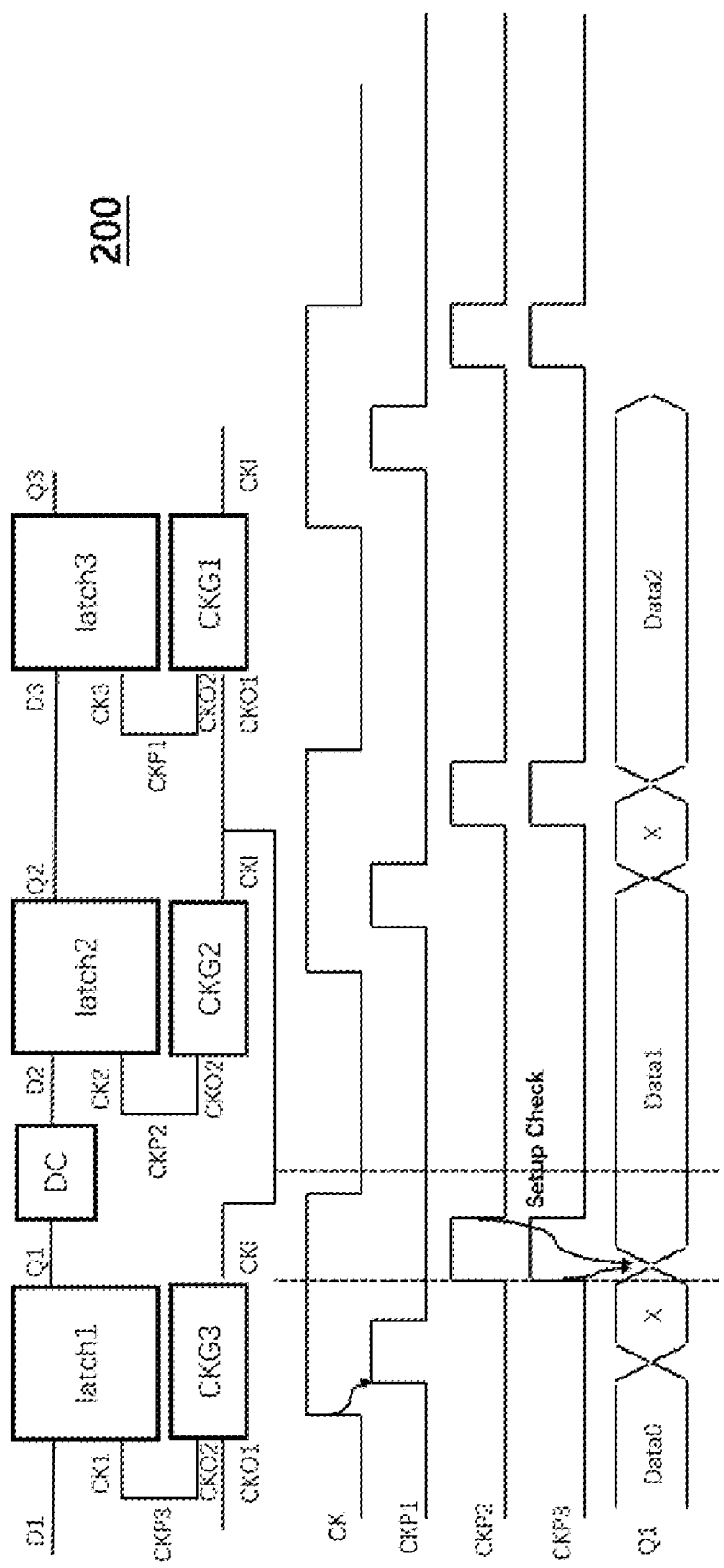
FIG. 14 is a schematic diagram of a circuit structure and a sequence diagram of a latch, according to another embodiment of this application.

FIG. 14 is a schematic diagram of a circuit structure and a sequence diagram of a latch, according to an embodiment of this application. As shown in FIG. 14, a difference from the embodiment shown in FIG. 13 lies in that the first output end CKO1 of the clock generation circuit CKG1 is electrically connected to the input end CKI of the clock generation circuit CKG2 as well as the input end CKI of the clock generation circuit CKG3. Therefore, when there is a relatively large logic delay between two levels of adjacent latch circuits—such as latch1 and latch2, for example—which occurs when an output end Q1 of latch1 and an input end D2 of latch2 are electrically connected to a delay circuit DC, a problem of clock setup of a critical timing path may be resolved, to improve the working efficiency of the latch.

In an actual application, one level of latch circuit may correspond to one level of clock generation circuit, that is, one level of clock generation circuit provides a clock signal to one level of latch circuit. Alternatively, each level of latch circuit includes a plurality of latch units connected in series, a plurality of latch units connected in parallel, or a plurality of latch units in a combination of serial and parallel connections. That is, one level of clock generation circuit provides a clock signal to a plurality of latch units. In addition, as required by a load drive, each level of clock generation circuit may alternatively include a plurality of clock generation circuits, and one clock generation circuit corresponds to one latch unit. Therefore, the plurality of formed clock generation circuits are connected together to form a clock tree. Because the cascading sequence of the latch circuits is opposite to the cascading sequence of the clock generation circuits, a reverse clock tree is formed. In addition, functions of signal re-establishment and enhancement are implemented by using the second output end CKO2 of the clock generation circuit 100. When the clock tree has a large fanout, that is, loading of the clock tree is large, the data transmission performance may be improved.

Based on the foregoing, the clock generation circuit provided by this application can generate a clock signal with the same pulse width regardless of a waveform of an initial clock signal of the clock generation circuit, and can effectively shape a pulse of the clock signal. In addition, due to the use of a design structure of a reverse clock tree, the latch provided by this application can effectively implement complete staggering of phases of clock signals, reduce a quantity of used clock buffers, and improve the correctness and accuracy of data transmission and latching.

This application further provides a computing device, including one or more latches, configured to store and transmit data.

In other words, this application may further have a plurality of other embodiments. A person skilled in the art may make various corresponding changes and variations according to this application without departing from the spirit and essence of this application. However, such corresponding changes and variations shall fall within the protection scope of the claims appended to this application.

INDUSTRIAL APPLICABILITY

The clock generation circuit, the latch using same, and the computing device provided in this application have the following beneficial effects.

The clock generation circuit provided by this application may generate a clock signal with the same pulse width regardless of a waveform of an initial clock signal of the clock generation circuit, and may effectively shape a pulse of the clock signal. In addition, due to the use of a design structure of a reverse clock tree, the latch may effectively implement complete staggering of phases between clock signals, reduce a quantity of used clock buffers, and improve the correctness and accuracy of data transmission and latching.

What is claimed is:

1. A clock generation circuit, comprising:
an input end, configured to input a pulse signal;
a first output end, configured to output a first clock signal;
a second output end, configured to output a second clock signal; and
an input drive circuit, a latch circuit, an edge shaping circuit, a feedback delay circuit, and an output drive circuit, wherein:
the input end is connected to the input drive circuit,
the input drive circuit is connected to the latch circuit and the edge shaping circuit,
the latch circuit is connected to the edge shaping circuit and the feedback delay circuit,
the edge shaping circuit is connected to the feedback delay circuit and the output drive circuit, and
the output drive circuit is connected to the first output end and the second output end.

2. The clock generation circuit according to claim 1, wherein:
the input drive circuit comprises a first inverter and a second inverter that are sequentially connected in series; and
each of the first inverter and the second inverter comprises a first end and a second end.

3. The clock generation circuit according to claim 2, wherein:
the first end of the first inverter is connected to the input end;
the second end of the second inverter is connected to the latch circuit; and
the second end of the first inverter is connected to the first end of the second inverter and the edge shaping circuit.

4. The clock generation circuit according to claim 2, wherein:
the latch circuit comprises a first NAND gate and a second NAND gate connected to each other; and
each of the first NAND gate and the second NAND gate comprises a first end, a second end, and a third end.

5. The clock generation circuit according to claim 4, wherein:
the first end of the first NAND gate is connected to the third end of the second NAND gate;
the second end of the first NAND gate is connected to the feedback delay circuit;
the third end of the first NAND gate is connected to the second end of the second NAND gate and the edge shaping circuit; and
the first end of the second NAND gate is connected to the second end of the second inverter.

6. The clock generation circuit according to claim 4, wherein:
the edge shaping circuit comprises a first PMOS transistor, a second PMOS transistor, a third PMOS transistor, a first NMOS transistor, a second NMOS transistor, and a third NMOS transistor; and
each of the first PMOS transistor, the second PMOS transistor, the third PMOS transistor, the first NMOS transistor, the second NMOS transistor, and the third NMOS transistor comprises a first end, a second end, and a control end.

7. The clock generation circuit according to claim 6, wherein:
the first end of the first PMOS transistor and the first end of the second PMOS transistor are connected to a power supply;
the second end of the first PMOS transistor and the second end of the second PMOS transistor are connected to the first end of the third PMOS transistor;
the second end of the third PMOS transistor is respectively connected to the first end of the first NMOS transistor and the first end of the second NMOS transistor;
the second end of the second NMOS transistor is connected to the first end of the third NMOS transistor;
the second end of the first NMOS transistor and the second end of the third NMOS transistor are connected to a ground;
the control end of the first PMOS transistor and the control end of the second NMOS transistor are connected to the second end of the first inverter;
the control end of the third PMOS transistor and the control end of the first NMOS transistor are connected to the third end of the first NAND gate; and
the control end of the second PMOS transistor and the control end of the third NMOS transistor are connected to the second end of the third PMOS transistor, the feedback delay circuit, and the output drive circuit.

8. The clock generation circuit according to claim 6, wherein:
the feedback delay circuit comprises a first end, a second end, and a plurality of inverters connected between the first end of the feedback delay circuit and the second end of the feedback delay circuit in series.

9. The clock generation circuit according to claim 8, wherein:
the first end of the feedback delay circuit is connected to the second end of the third PMOS transistor; and
the second end of the feedback delay circuit is connected to the second end of the first NAND gate.

10. The clock generation circuit according to claim 8, wherein:
the output drive circuit comprises a third inverter, a fourth inverter, and a fifth inverter; and
each of the third inverter, the fourth inverter, and the fifth inverter comprises a first end and a second end.

11. The clock generation circuit according to claim 10, wherein:
the first end of the third inverter is connected to the second end of the third PMOS transistor;
the second end of the third inverter is connected to the first output end;
the first end of the fourth inverter is connected to the second end of the third PMOS transistor;
the second end of the fourth inverter is connected to the first end of the fifth inverter; and
the second end of the fifth inverter is connected to the second output end.

12. A latch, comprising:
a plurality of levels of latch circuits; and
a plurality of levels of clock generation circuits each comprising:
an input end, configured to input a pulse signal;
a first output end, configured to output a first clock signal;
a second output end, configured to output a second clock signal; and
an input drive circuit, a latch circuit, an edge shaping circuit, a feedback delay circuit, and an output drive circuit, wherein:
the input end is connected to the input drive circuit,
the input drive circuit is connected to the latch circuit and the edge shaping circuit,
the latch circuit is connected to the edge shaping circuit and the feedback delay circuit,
the edge shaping circuit is connected to the feedback delay circuit and the output drive circuit, and
the output drive circuit is connected to the first output end and the second output end.

13. The latch according to claim 12, further comprising:
a data input end, configured to input a data signal;
a data output end, configured to output the data signal; and
a clock signal input end, configured to input a clock signal;
wherein the plurality of levels of latch circuits are sequentially connected between the data input end and the data output end in series according to a first sequence;
wherein the plurality of levels of clock generation circuits are sequentially connected in series according to a second sequence and connected to the plurality of levels of latch circuits; and
wherein a direction of the first sequence is opposite to a direction of the second sequence.

14. The latch according to claim 13, wherein one level of the levels of latch circuits corresponds to one level of the levels of clock generation circuits.

15. The latch according to claim 13, wherein each level of the levels of latch circuits further comprises a plurality of latch circuits.

16. The latch according to claim 15, wherein the plurality of latch circuits are connected in series or parallel.

17. The latch according to claim 15, wherein the plurality of latch circuits are in a combination of serial and parallel connections.

18. The latch according to claim 15, wherein each level of the levels of clock generation circuits further comprises a plurality of clock generation circuits.

19. The latch according to claim 18, wherein each of the plurality of latch circuits corresponds to each of the plurality of clock generation circuits.

20. A computing device, comprising one or more latches each comprising a plurality of levels of latch circuits and a plurality of levels of clock generation circuits, wherein each of the plurality of levels of clock generation circuits each comprises:
- an input end, configured to input a pulse signal;
- a first output end, configured to output a first clock signal;
- a second output end, configured to output a second clock signal; and
- an input drive circuit, a latch circuit, an edge shaping circuit, a feedback delay circuit, and an output drive circuit, wherein:
- the input end is connected to the input drive circuit,
- the input drive circuit is connected to the latch circuit and the edge shaping circuit,
- the latch circuit is connected to the edge shaping circuit and the feedback delay circuit,
- the edge shaping circuit is connected to the feedback delay circuit and the output drive circuit, and
- the output drive circuit is connected to the first output end and the second output end.

* * * * *